(12) United States Patent
Carreau

(10) Patent No.: US 7,982,643 B2
(45) Date of Patent: Jul. 19, 2011

(54) SYSTEM AND METHOD FOR REDUCING PATTERN NOISE IN ANALOG SYSTEM PROCESSING

(75) Inventor: Gary Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/622,928

(22) Filed: Nov. 20, 2009

(65) Prior Publication Data

US 2011/0043397 A1    Feb. 24, 2011

Related U.S. Application Data

(60) Provisional application No. 61/235,581, filed on Aug. 20, 2009.

(51) Int. Cl.
  *H03M 1/20* (2006.01)
(52) U.S. Cl. .................. 341/131; 341/155; 341/156
(58) Field of Classification Search .................. 341/131, 341/155, 120, 143, 156
  See application file for complete search history.

(56) References Cited

U.S. PATENT DOCUMENTS

| | | | | |
|---|---|---|---|---|
| 5,144,308 | A * | 9/1992 | Norsworthy | 341/131 |
| 5,724,383 | A * | 3/1998 | Gold et al. | 375/141 |
| 5,889,482 | A * | 3/1999 | Zarubinsky et al. | 341/131 |
| 6,084,538 | A * | 7/2000 | Kostelnik et al. | 341/120 |
| 6,172,629 | B1 * | 1/2001 | Fetterman | 341/131 |
| 6,351,229 | B1 * | 2/2002 | Wang | 341/143 |
| 6,831,574 | B1 * | 12/2004 | Mills et al. | 341/50 |
| 6,880,262 | B1 * | 4/2005 | Jensen | 341/155 |
| 2005/0146453 | A1 | 7/2005 | Jensen et al. | |
| 2006/0038712 | A1 | 2/2006 | Harrison et al. | |
| 2008/0013720 | A1 | 1/2008 | Degele | |

OTHER PUBLICATIONS

PCT International Search Report and Written Opinion for PCT/US2010/42688 mailed on Sep. 14, 2010.

* cited by examiner

*Primary Examiner* — Jean B Jeanglaude
(74) *Attorney, Agent, or Firm* — Kenyon & Kenyon LLP

(57) ABSTRACT

An analog-to-digital conversion system includes an analog-to-digital converter (ADC), a plurality of receivers, each for capturing input analog signals, a multiplexer having inputs coupled to each of the receivers and an output coupled to the ADC, the multiplexer establishing a signal path between a selected one of the inputs and the output in response to an index signal, and a mux controller to supply a random sequence of index signals to the multiplexer.

21 Claims, 10 Drawing Sheets

Prior Art

SYSTEM AND METHOD FOR REDUCING PATTERN NOISE IN ANALOG SYSTEM PROCESSING

CROSS-REFERENCE TO RELATED APPLICATIONS

This application claims priority from U.S. Provisional Patent Application 61/235,581, filed on Aug. 20, 2009, which is incorporated herein in its entirety.

FIELD OF THE INVENTION

The present invention is generally directed to mixed signal processing. In particular, the present invention is directed to systems and methods for mitigating pattern noise and crosstalk in mixed-signal processing chips.

BACKGROUND INFORMATION

Concurrent processing of multiple data channels in analog or mixed-signal systems may lead to crosstalk among channels and/or pattern noise within different channels. For example, while the capture of the analog data from a sensor array may be carried out in parallel, the processing of the captured data may include both serial and parallel processing. This mixed data processing often may cause the undesired crosstalk/pattern noise.

By way of example, FIG. 1(A) shows a system-on-chip (SOC) architecture of an analog-to-digital converter (ADC) system coupled at inputs with an array of analog sensors and at outputs with a field-programmable gate array (FPGA). In this example, the array of analog sensors may include 256 sensors such as photo diodes. The analog sensors may convert physical quantities (such as light intensity) into analog electrical signals. The ADC system may include internal sampling circuits 0-255 (integrators and correlated-differential sampling devices (CDSs)), multiplexers, and analog-to-digital converters (ADCs). The analog signals on the large analog sensor may be captured simultaneously. In practice, a large analog sensor may be divided into groups of sensors to be handled by an array of SOC cells (or sub-systems) like the one shown in FIG. 1(B). For example, the 256 analog sensors may be divided into 8 groups, each group having 32 analog sensors. Thus, each SOC cell (or sub-system) may process the 32 analog inputs sequentially based on a common clock signal between cells.

Referring to FIG. 1(B), internal sampling circuits that are coupled to analog sensors may, acting as analog receivers, capture and store the analog signals. An analog-to-digital converter (ADC) may be coupled to the internal sampling circuits via a multiplexer. The multiplexer may have multiple input nodes (e.g., 32 input nodes), one output node, and a select node. Thus, the multiplexer may connect one of the input nodes to the output node based on an index signal on the select node. For example, each input node may be labeled with an index number. Thus, when an index number is supplied to the select node of the multiplexer, the input node correspondingly labeled with the index number may be connected to the output by forming a signal path from the selected input node to the output node. The ADC may retrieve an analog signal through the selected signal path. The ADC may then convert the analog signal through the selected signal path into a digital signal. Commonly, a counter, coupled to the select node, may provide sequentially-increasing count number to the select node. The sequentially-increasing count number may represent the index number of input nodes to be connected to the output node. For this example, the counter coupled to the multiplexer may generate indices of 0 to 31 sequentially in accordance with a clock signal CLK_ADC. The input nodes may be connected to the output node in the order of 0-31. After cycling through the 32 input nodes, the counter may automatically reset to 0 before the start of next acquisition cycle of 32 analog signals to the ADC sub-system.

Referring to FIG. 1(B), for each acquisition cycle of the ADC sub-system, the 32 analog channels of sensor data may be sampled in parallel and then processed sequentially through the ADC converter. In this design, the analog signals may be sampled in parallel onto internal sampling capacitors. While retrieving analog signals stored in the capacitors via multiplexers, crosstalk may result among signal paths of different data channels in multiplexers. FIG. 2 illustrates a common layout of routings where parasitic capacitance (CP) may exist between routings of the two 4:1 and one 8:1 sub-multiplexers. These parasitic CP's may produce undesired crosstalk. Although crosstalk among different routes may be minimized by optimizing system timing and the chip layout, there still may be some level of residual crosstalk that may create adverse effects perceivable to an observer.

Besides crosstalk, pattern noise may be another source of undesired effects that may arise in designs like FIG. 1. Still, by way of the example shown in FIG. 1(B), for the 32 analog sensors, the ADC may sequentially convert the analog signals stored in the internal sampling capacitors. Therefore, the throughput of the system may be $32*T_{ADC}$, where $T_{ADC}$ is the ADC conversion rate (or the ADC sampling frequency—the speed at which the ADC converter outputs a new binary number).

FIG. 3 shows a portion of an acquisition cycle (eight out of 32 ADC cycles). In addition to the ADC clock, the cell also may run other clock and timing signals including a reset time signal (Reset) for resetting the system, and two clocks for the CDS operation (CLK_CDS1, CLK_CDS2). These additional timing signals and clocks may generate system activities. Over the entire acquisition cycle (of 32 ADC cycles), there may be different levels of system activities on and off the ADC chip. These activities may cause adverse effects on the conversion results. Referring to FIG. 3, the ADC conversion may be exposed to the system activities caused by system resetting during pulse 1 (and similarly, pulse 1 in the next acquisition cycle) and disturbed by the parallel sampling clock signals (CLK_CDS1, CLK_CDS2) during pulses 4 and 6 (and similarly, pulses 4 and 6 in the next ADC cycle). The system may be quiet during pulses 2, 3, 5, 7, and 8 of ADC conversion. When these system activities repeatedly happen at fixed time instances during each ADC acquisition period, they may cause fixed pattern noise in the eventual digital signals.

On an array image sensor (such as an x-ray image sensor), crosstalk/pattern noise may be easily perceived by a human observer even when the amount of crosstalk/pattern noise is much less than the overall system noise. Therefore, even a small amount of crosstalk/pattern noise may adversely affect the overall performance of the ADC system. Therefore, there is a need to reduce the adverse effects of correlated noise caused by the fixed relationship between sensors and system activities.

DETAILED DESCRIPTION

The present invention minimizes the adverse effects of residual crosstalk/pattern noise in the output of an ADC conversion system. The proposed solution realizes that when concurrently happening system activities affect a fixed sampling sequence of ADC converters, pattern noise may result. Further, the proposed solution realizes that by randomizing the sampling sequence of ADC converters, the correlated pattern noise may be replaced by uncorrelated noise dispersed among all data channels which may be indistinguishable from system noise.

Embodiments of the present invention provide an analog-to-digital conversion system. The system may include an analog-to-digital converter (ADC), a plurality of receivers, each for capturing input analog signals, a multiplexer having inputs coupled to each of the receivers and an output coupled to the ADC, the multiplexer establishing a signal path between a selected one of the inputs and the output in response to an index signal; and a mux controller to supply a random sequence of index signals to the multiplexer.

Embodiments of the present invention provide a method which may include steps of: (a) generating a random sequence of indices; (b) transmitting an index from the random sequence of indices to a select node of a multiplexer; (c) connecting an input node of the multiplexer to an output node of the multiplexer, the input node being selected based on the index; (d) counting the connection in a counter; (e) if a count in the counter is less than a number of the input nodes, repeat steps (b)-(d); and (f) if the count in the counter is equal to or more than the number of the input nodes, repeat steps (a)-(e).

Figure 4:
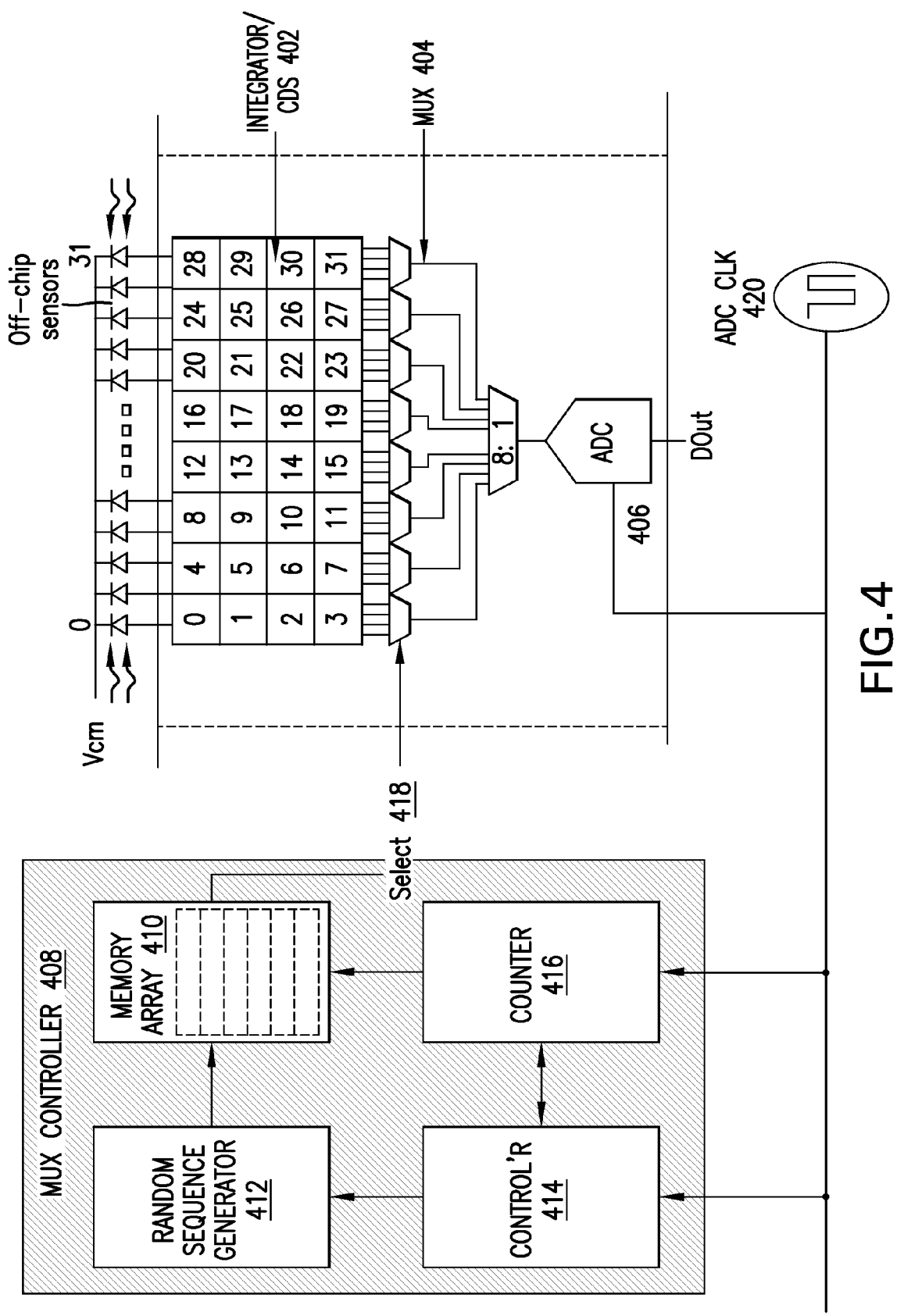
FIG. 4 illustrates an ADC conversion unit with randomized switching according to an embodiment of the present invention.

FIG. 4 is a simplified block diagram of an ADC conversion cell 400 with randomized switching according to one embodiment of the present invention. The ADC cell 400 may include an array of sampling circuits 402 corresponding to each of the inputs. The cell 400 further may include a multiplexer system 404, an analog-to-digital converter (ADC) 406 and a MUX controller 408. The sampling circuits 402 may include integrators and CDS circuits (not shown) as may be common for analog sensors. The sampling circuits 402 may generate analog output signals representing the sensor outputs. The MUX array 404 may route the sampling circuits' output signals to the ADC 406 under control of the MUX controller 408. The MUX controller 408 may control MUX array 404 switching functions in a pseudo-random manner to mitigate effects of crosstalk or pattern noise.

In one embodiment, the MUX controller 408 may include a memory array 410, a pseudo-random sequence generator 412, a controller 414, and a counter 416. The memory array 410 may store a randomly generated array of selection indices that, when output to the MUX array 404, cause the MUX array 404 to route an analog signal from a sampling circuit 402 corresponding to the respective index to the ADC. Thus, in a system including N sampling circuits 402, the memory array 410 may include storage for N indices. The random sequence generator 412 may generate the indices according to a pseudo-random, non-repeating pattern, which are stored to the memory array 410. An output from the counter 408 may be used as an address to the memory array 410 to cause a corresponding index to be output to the MUX array 404 on each ADC clock cycle. The controller 414 may be a state machine that manages operations of the MUX controller.

Figure 1A:
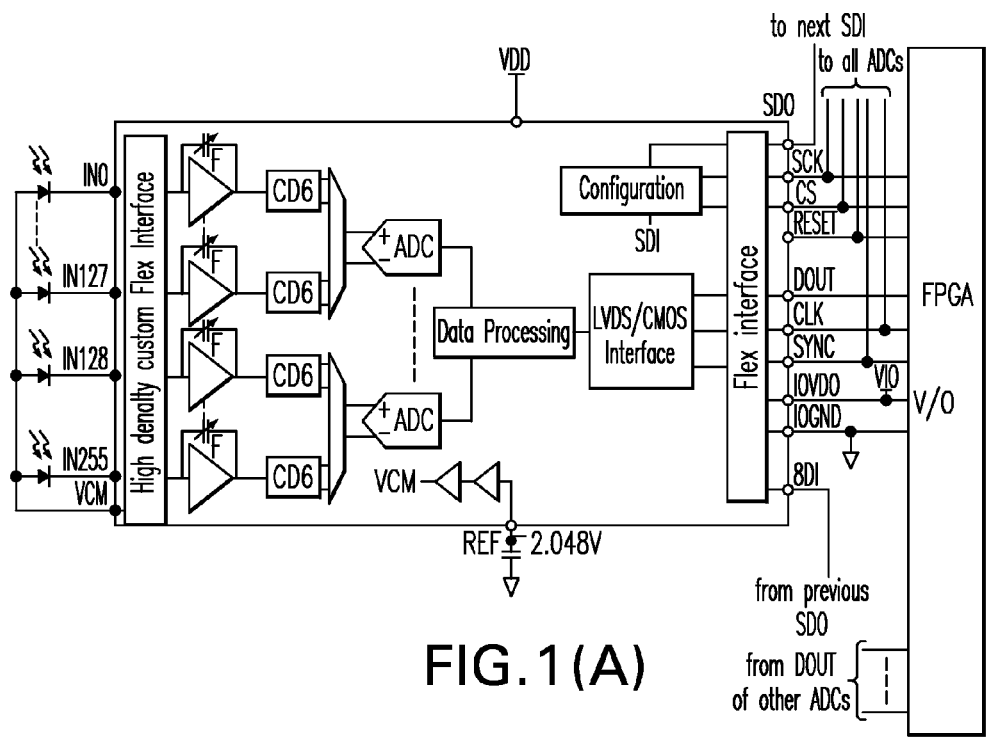
FIG. 1(A) is an analog-to-digital converter system.
Figure 1B:
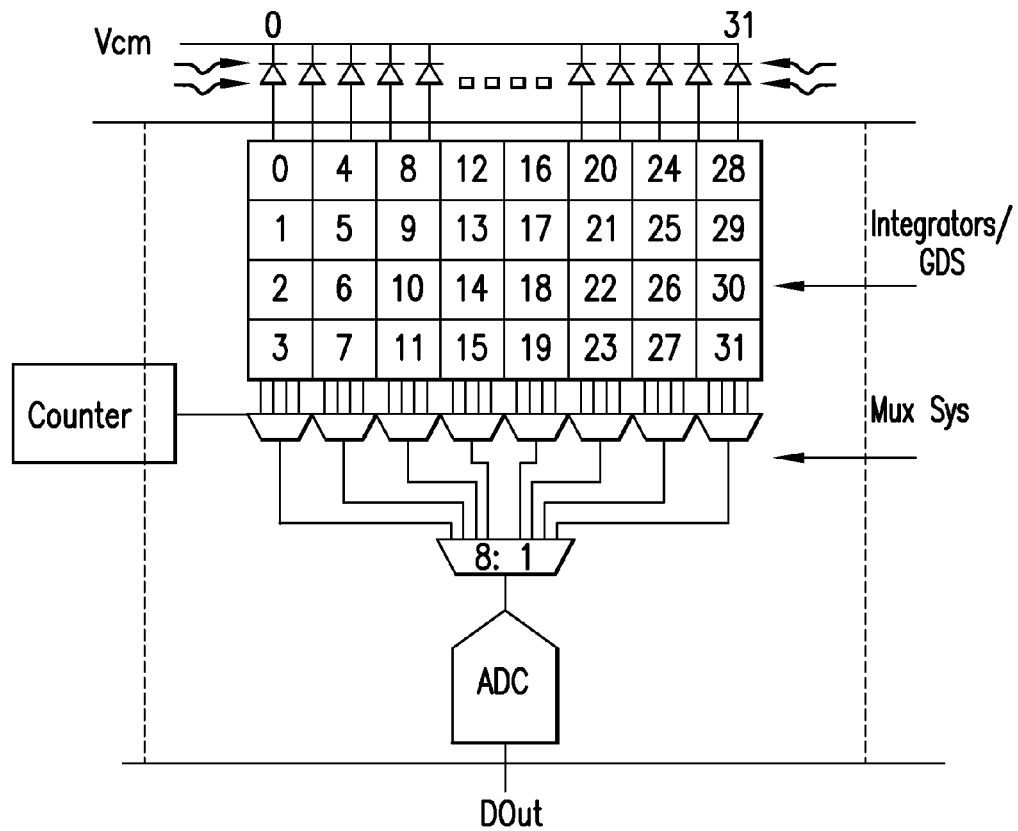
FIG. 1(B) is a zoomed-in view of one cell of ADC system as shown in FIG. 1(A).
Figure 2:
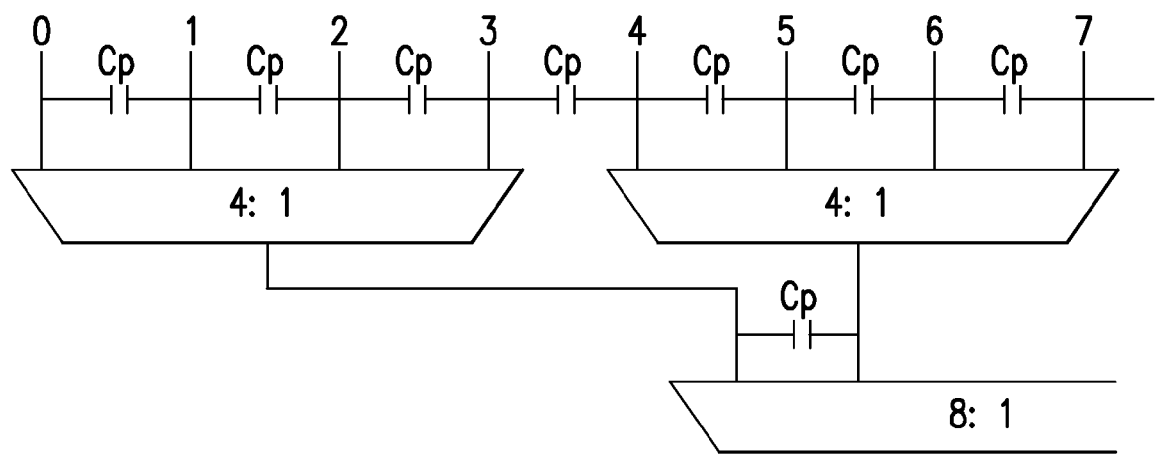
FIG. 2 illustrates crosstalk among signal paths of a multiplexer system.
Figure 3:
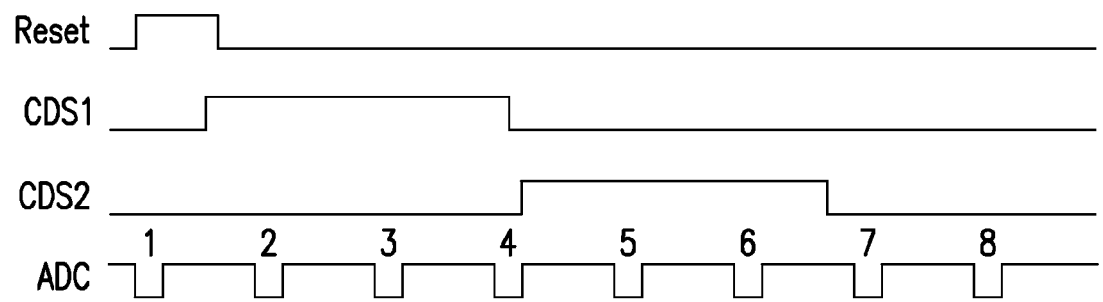
FIG. 3 illustrates system activities with respect to an ADC clock signal.

The MUX array 404 may be provided as a hierarchical array of multiplexers such as shown in FIG. 2. Although unnecessary, it is convenient to provide the number of inputs N as a power of two (e.g., $N=2^X$, where X is an integer). In such a case, the memory array 410 may store indices that are X bits wide. The multiplexers at each stage in the hierarchical MUX array 404 also may have a number of inputs that is a power of two. For example, in a system with 32 inputs ($2^5$ inputs) a first stage may include sub-multiplexers with an input/output ratio of 4:1 ($2^2$:1), and the second stage may include sub-multiplexers with an input/output ratio of 8:1 ($2^3$:1). Therefore, the combined two stage multiplexer may have an input/output ratio of 32:1. In such an example, the MUX array 404 may support 32 distinct signal paths, each of which may connect one of the 32 sampling circuits 402 to the ADC 406. An index number provided to the select node may determine which signal path is switched on.

The ADC 406 may be provided in a convenient architecture for analog to digital converters such as direct conversion ADCs, successively-approximation ADCs, pipelined ADCs, or commonly suitable ADCs found in mix-signal processing chips. Such ADCs commonly work in two phases: an acquisition phase in which a charge is input to the ADC and a conversion phase in which the ADC generates a digital codeword representing the magnitude of charge input to the ADC. Each cycle of ADC operation, measured from the onset of the acquisition phase to the conclusion of the conversion phase, may consume several cycles of the driving clock CLK. The MUX controller 408 may output a new index to the MUX array 404 once per ADC cycle of the CLK_ADC.

As noted, the counter may be an N bit counter that increments once per ADC cycle of CLK_ADC. When the counter 416 overflows, it may indicate that the Nth index has been read from the memory array 410 to the MUX array 404. In such an event, the controller 414 may cause the random sequence generator 412 to re-seed the memory array 410 with a new set of randomly generated indices. The controller 414 and random sequence generator 412 may operate at the CLK rate rather than the ADC cycle rate, which may cause the memory array 410 to be re-seeded without interrupting continuous operation of the ADC 406.

Components of the ADC cell may work under a clock signal CLK_ADC supplied from an ADC clock 414. The randomized index supplied to a select node of the multiplexer may determine which multiplexer input to be connected to the multiplexer output. In this way, signal paths in the multiplexer may be sequentially switched on in a random order based on the randomized indices stored in the memory. After cycling through all inputs within an acquisition period, a new sequence of randomized indices may be generated and stored in the memory. Then, signal paths in the multiplexer may be sequentially switched on in a new random order based on the newly generated randomized indices stored in the storage. By randomizing the order of ADC conversion between sets of ADC conversions, the adverse effects of system activities on ADC conversion may be scattered to different channels, which may lead to less perceivable pattern noise.

Figure 5:
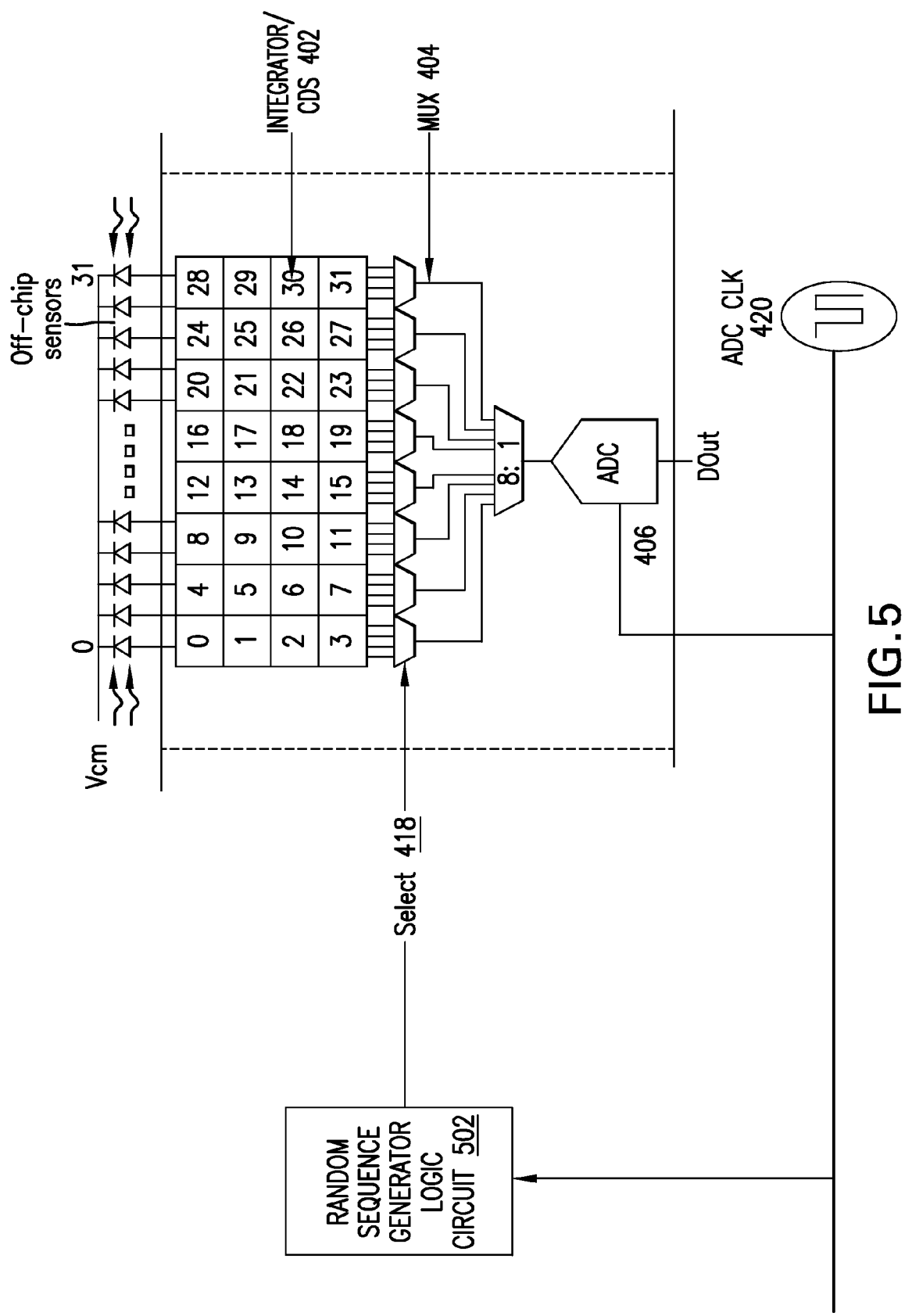
FIG. 5 illustrates an ADC conversion unit with randomized switching according to another embodiment of the present invention.

In another embodiment of the present invention, the mux controller 408 may be replaced by a logic circuit 502 that generates random sequences and directly supply the generated sequences to the select node of multiplexer 404. FIG. 5 illustrates a system that uses a random sequence generator logic circuit to control the multiplexer 404. The logic circuit 502 may be configured to generate consecutive random sequences each of which is N number long. For example, if N is 32 as shown in FIG. 5, each random sequence may contain a random sequence of 0 to 31. The logic circuit 502 may generate consecutive 32 long random sequences and supply to the multiplexer 404 as the order of input pins to be connected to the output of the multiplexer.

Figure 6:
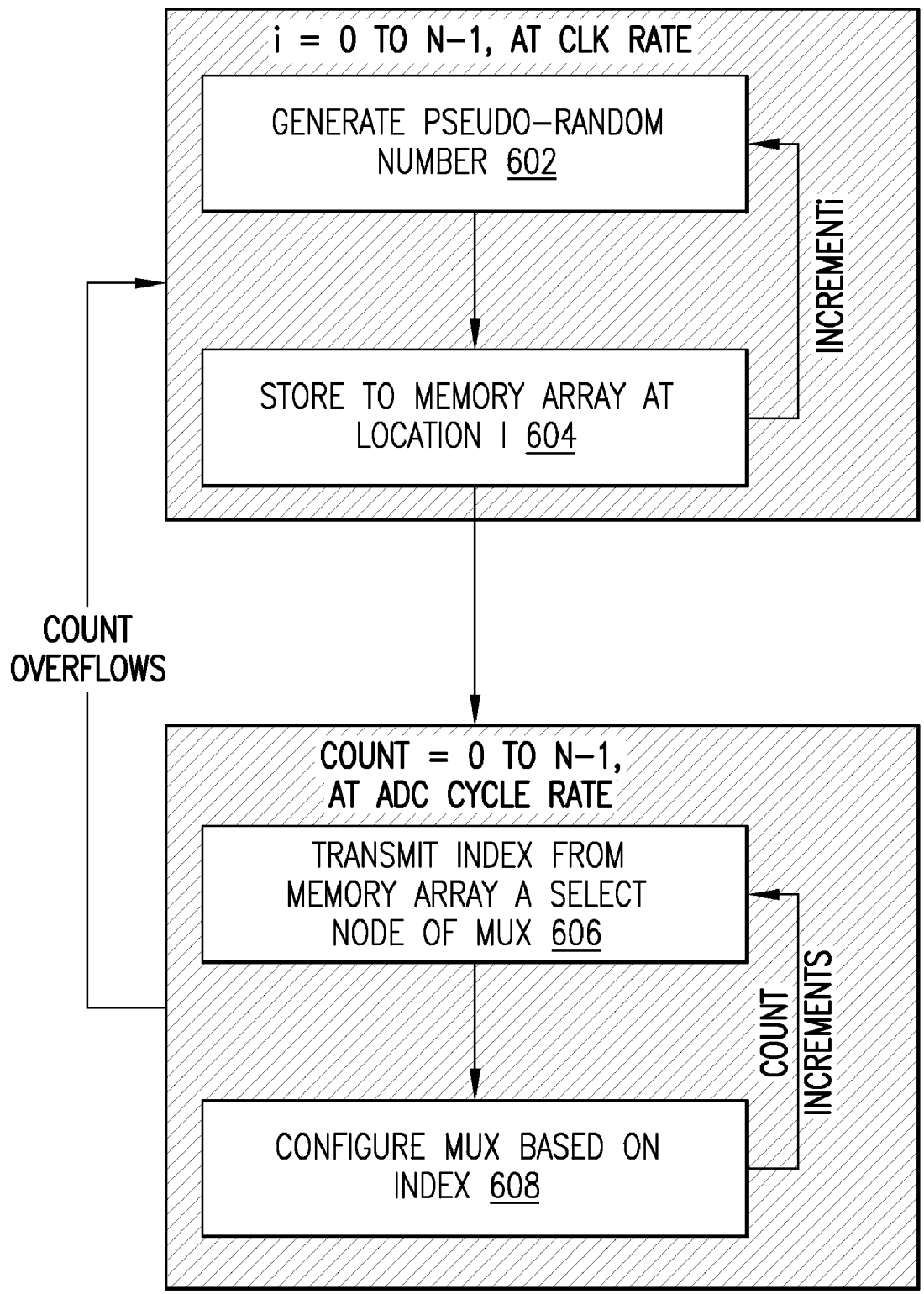
FIG. 6 illustrates a method for analog-to-digital conversion using randomized switching according to an embodiment of the present invention.

FIG. 6 illustrates how mux controller 408 works according to an embodiment of the present invention. At 602, the pseudo-random sequence generator may generate N randomized indices. In one embodiment, the randomized indices may be stored in the memory 410 sequentially from position 0 to N−1. In another embodiment, the random sequence may be generated by a logic circuit and directly supplied to the multiplexer. Referring to FIG. 6, each of the indices may correspond to one multiplexer input. During operation, the counter may increase a count increment (such as by 1) for each ADC cycle. The count increase may cause the controller to transmit an index from a memory location i to the select node of the multiplexer. The index at the select node may cause reconfiguration that may provide a signal path from multiplexer input node of the index to the multiplexer output node. The ADC may then retrieve the analog signal through the signal path and convert it to digital signal. Similarly, for the next ADC cycle, the counter may be increased by the count increment again. The count increase may cause the controller to transmit a next index from a memory location i+1 to the select node of the multiplexer. The next index at the select node may cause reconfiguration that may provide a signal path from multiplexer input node of the next index to the multiplexer output node. The process may be repeated until the counter has reached its limit N (or overflow). At overflow, the counter may reset, which may cause the generator to generate another N randomized indices and store them in the memory for converting next set of N analog signals at multiplexer inputs.

Figure 7:
FIG. 7 illustrates an exemplary memory storing random indices according to an embodiment of the present invention.
Figure 8:
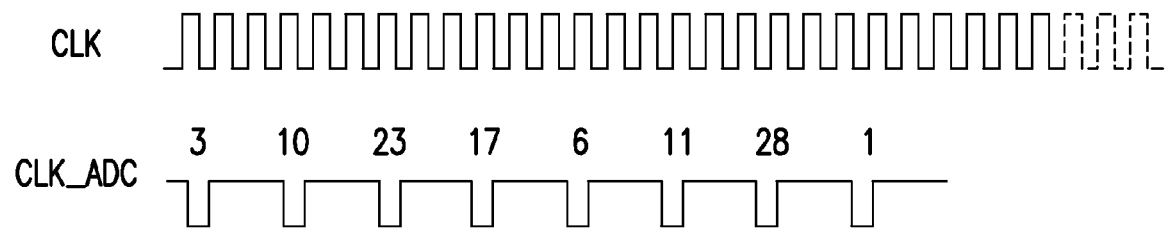
FIG. 8 illustrates an exemplary train of ADC clocks corresponding to the random indices stored in the memory of FIG. 7 according to an embodiment of the present invention.

The transmission of analog signals may be illustrated in the following example. FIG. 7 shows an exemplary memory stored thereon a sequence of randomized indices. FIG. 8 shows an exemplary system clock CLK and first eight ADC cycles with corresponding indices as stored in the storage shown in FIG. 7. For a 32 input multiplexer, the memory may have 32 sub-partitions for storing the 32 indices. A position pointer may be formed to direct at the current index to be read out. The controller may advance the position pointer each time the counter updates, which may cause the transmission of the index pointed by the position pointer to the select node of the multiplexer. Thus, for the memory of FIG. 7 and ADC cycles of FIG. 8, inputs 3, 10, 23, 17 . . . of the multiplexer may be selectively connected to the multiplexer output for the ADC to convert into digital outputs. The digital output signal and its index may be subsequently transmitted to a processor or a memory for further processing and storage.

In another embodiment, the random sequence may be generated by a logic circuit and supplied to the multiplexer directly as shown in FIG. 5. Therefore, the logic circuit may generate consecutive random sequences and supply the random sequences to the multiplexer directly without storing in a memory.

Figure 9:
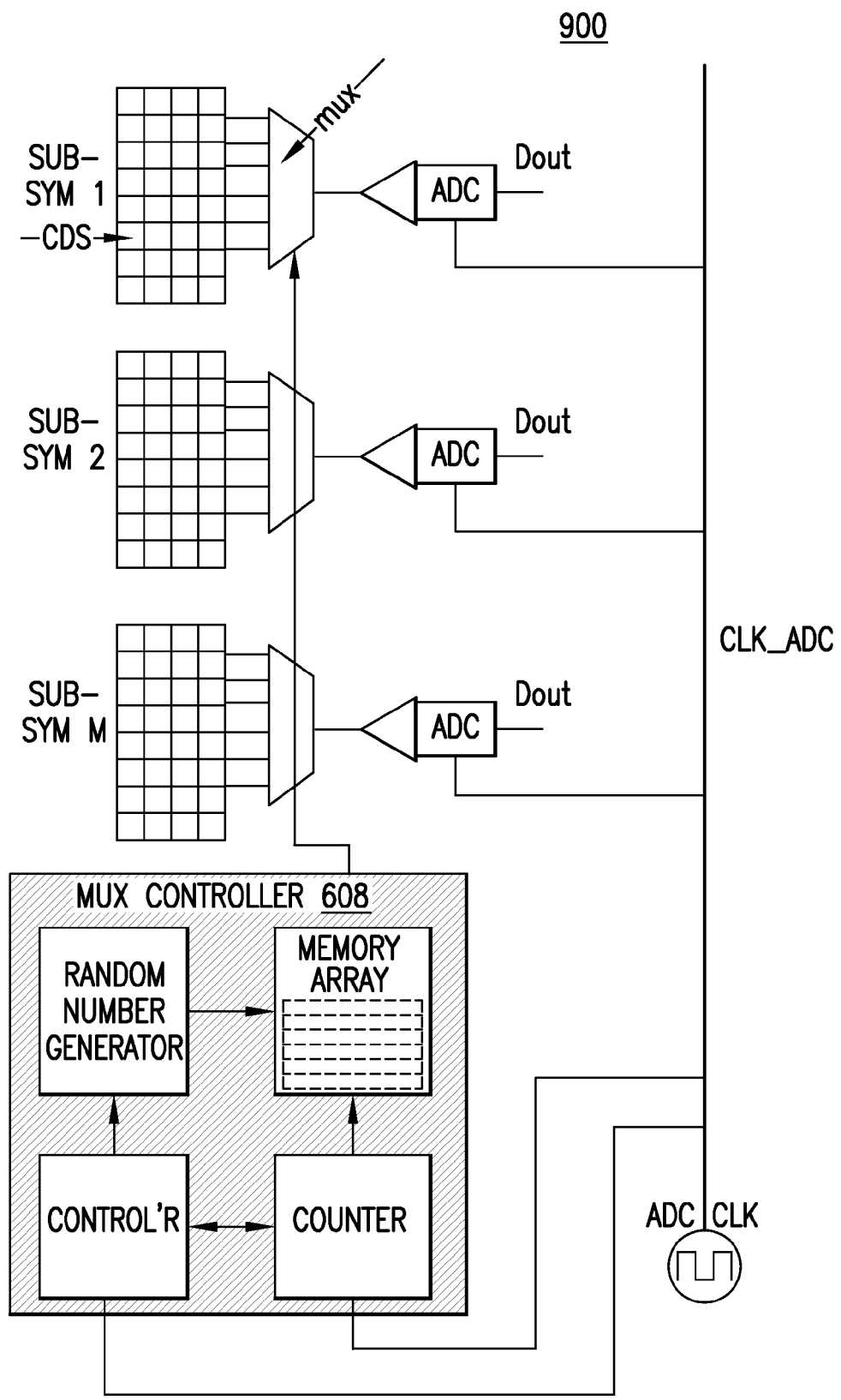
FIG. 9 illustrates an ADC system of multiple units according to an embodiment of the present invention.

FIG. 9 illustrates an ADC system with multiple units according to one embodiment of the present invention. The ADC system 900 may include multiple ADC cells (1 to M). Each cell may include N sampling circuits, a N:1 multiplexer, and an ADC. Referring to FIG. 9, all cells may share a common mux controller including a random sequence generator for generating randomized indices, a memory for storing the randomized indices, and a counter. Further, all of the multiple cells may share a common clock CLK_ADC via a bus. The common mux controller may provide randomized indices to all ADC cells. In operation, the random generator may generate a randomized sequence of indices for all of the cells to be stored in the memory. A counter update may cause the controller to transmit an index stored at i position of the memory to the select nodes of all multiplexers. This may further cause the input of each multiplexer corresponding to the index to be connected to the multiplexer output for ADC conversion. At the next ADC cycle, the counter may update again which may cause the controller to transmit the index at i+1 position of the memory to the select node of all multiplexers. As such, all cells in the ADC system may operate uniformly in steps as described in FIG. 6.

For illustration purpose, this embodiment is discussed in view of the unit cell of FIG. 4. However, it is understood that the multiple unit arrangement may also be implemented in view of the unit cell of FIG. 5 using a logic circuit. In such an embodiment, all units may share a random sequence generator logic circuit 502 and thus share random sequences.

Figure 10:
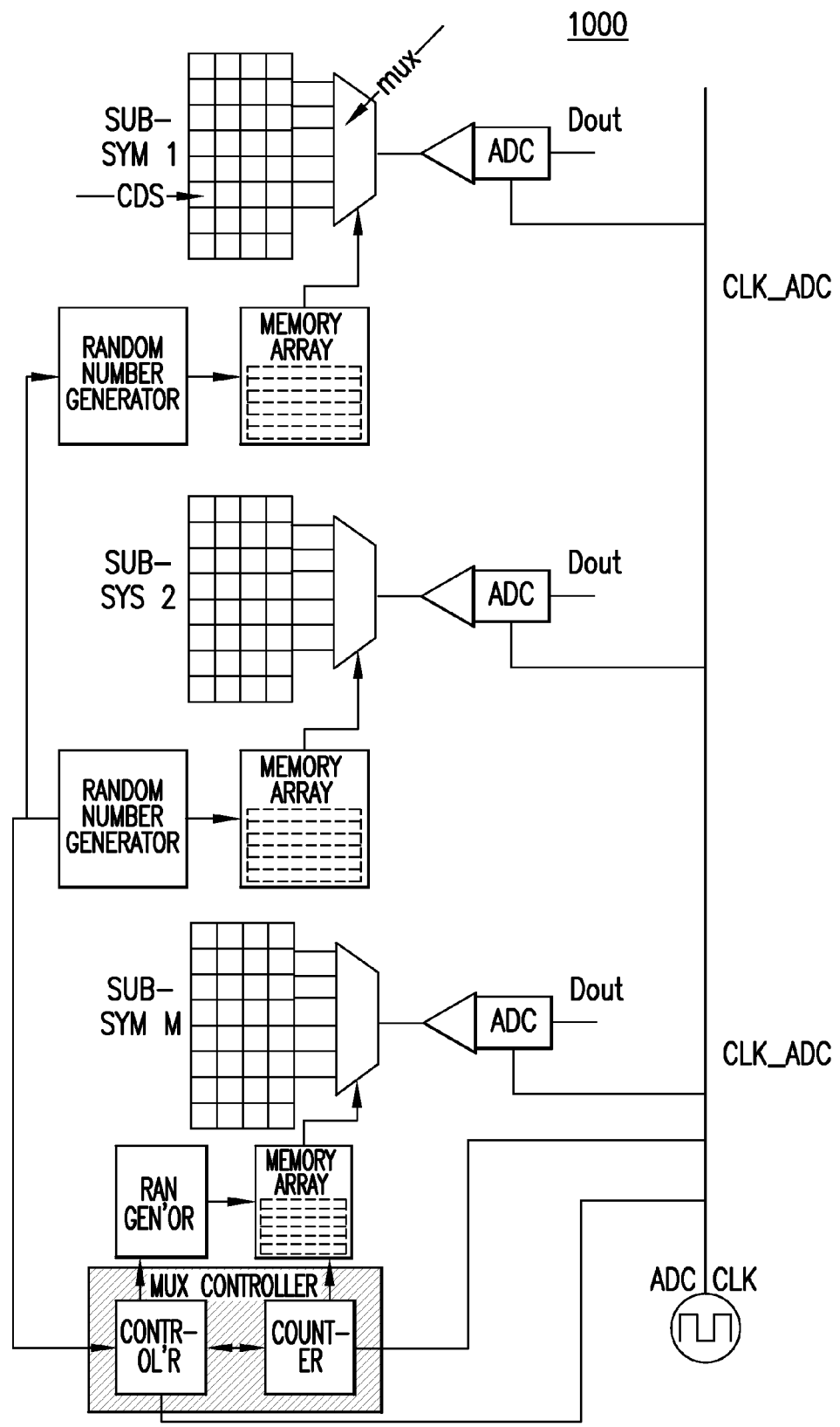
FIG. 10 illustrates another ADC system of multiple units according to an embodiment of the present invention.

FIG. 10 is a logic diagram of a randomized ADC converter array according to another embodiment of the present invention. In FIG. 9, by sharing the randomly-ordered indices among cells, the complexity to generate the random sequences may be reduced. However, the saving in complexity may be at the expense of some residual correlation among cells of the large sensor array.

In this embodiment as shown in FIG. 10, each cell may have a memory and an individualized randomized sequence of indices. The individualized sequence may be stored in the storage for each cell. All cells may share a common controller and a common counter for advancing pointer position. Therefore, each cell may have different random order of indices so that the correlation between cells may be minimized. All the cells may work under the same clock signal CLK_ADC. Thus, the operations of all cells may work in sync. In one embodiment, each cell may have its own random sequence generator (1, 2, . . . M) and memory storage (MEM 1, 2, . . . M). In another embodiment, only one random sequence generator may be used to generate M sequences of randomized indices at the beginning of an acquisition cycle. Each of the M sequences may be assigned to an cell. The memory storage also may be a single memory storage that has been sub-partitioned for each cell.

For illustration purpose, this embodiment is discussed in view of the unit cell of FIG. 4. However, it is understood that the multiple unit arrangement may also be implemented in view of the unit cell of FIG. 5 using a logic circuit. In such an embodiment, each cell may have its own random sequence generator logic circuit 502 and thus use different random sequences.

Figure 11:
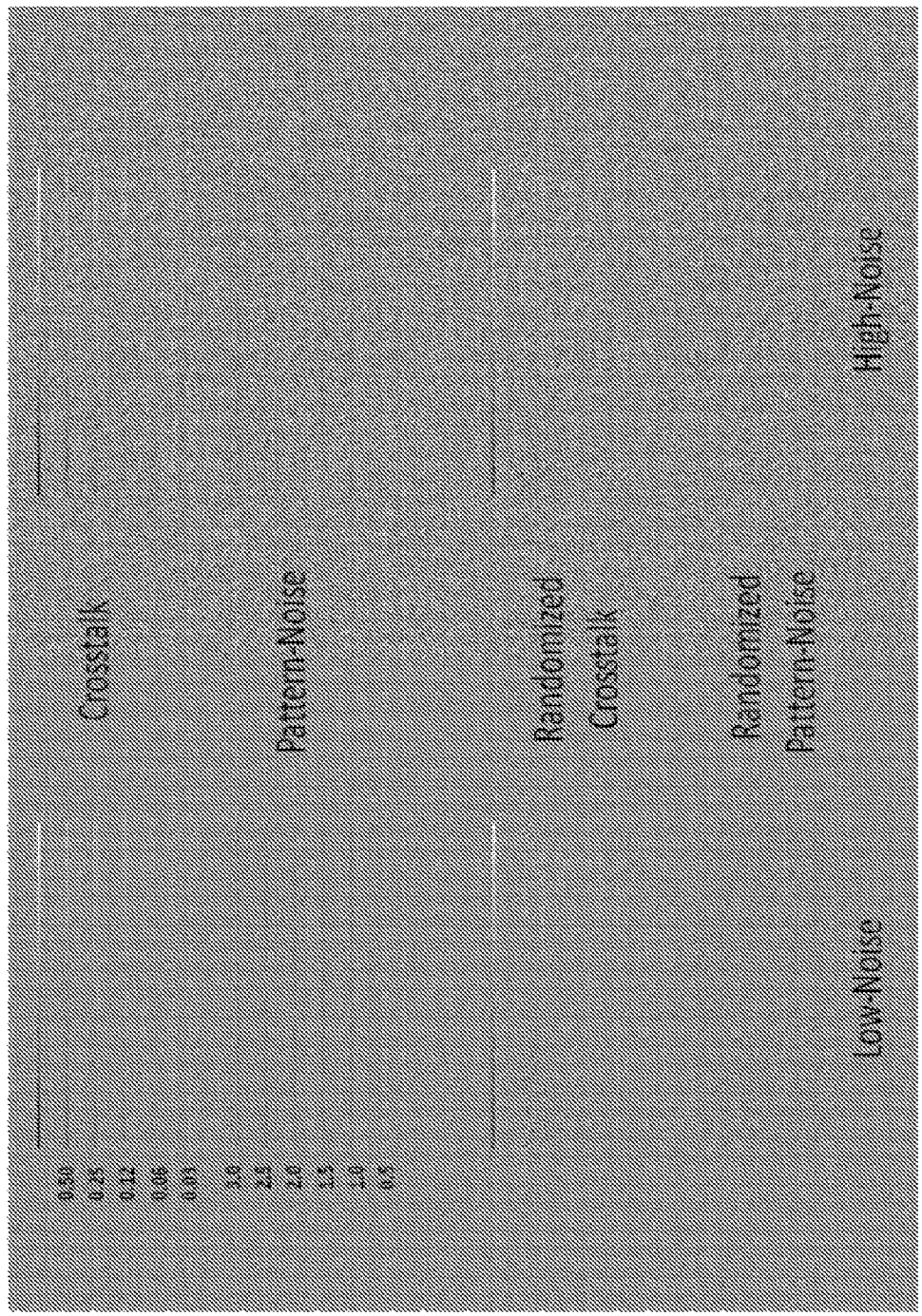
FIG. 11 illustrates the pattern noise reduction using the ADC of FIG. 4.

FIG. 11 shows a computer simulation of some common error sources and the results when processed using the technique described in FIG. 4. The environment on the left of FIG. 11 is a relatively low noise system, while the one on the right has 2× amount of noise. All other data is identical on both sides. The first set of lines, at the top, shows the effects of crosstalk, where a fixed percentage of the full scale signal appears on nearby pixels. The first line [1 pixel] is the full-scale signal which is swept from negative to positive full scale. The next six lines [separated by 16 pixels] have sequentially lower amounts of crosstalk [a factor of 2] from the full scale signal. The next grouping of six lines [beneath the crosstalk] shows the effect of varying levels of pattern-noise.

The two groupings of lines at the bottom of FIG. 11, show the same data as at the top, but when processed using the sequences of randomly-ordered indices. In this example, each group of 16 lines are randomized with the same pattern for the entire column, each column then gets a new random sequence. The full-scale input channel was not randomized and is shown as reference to the other lines. It may be seen from these results that the effects of crosstalk and pattern-noise have been greatly reduced and de-correlated for an observer.

Those skilled in the art may appreciate from the foregoing description that the present invention may be implemented in a variety of forms, and that the various embodiments may be implemented alone or in combination. For example, even though the present invention is discussed in view of ADC, the present invention may be readily applied to other types of mixed-signal processing circuits (such as digital-to-analog converter system) where crosstalk/pattern noise occurs because of concurrent signal paths and system activities. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An analog-to-digital converter system, comprising:
   an analog-to-digital converter (ADC);
   a plurality of receivers each for capturing analog signals;
   a multiplexer including a plurality of inputs each coupled to a respective one of the plurality of receivers and an output coupled to the ADC, the multiplexer establishing a signal path from a selected one of the plurality of inputs to the output in response to an index signal denoting the selected one of the plurality of inputs; and
   a mux controller to supply a random sequence of index signals to the multiplexer.

2. The analog-to-digital converter system of claim 1, wherein the multiplexer has N inputs, one output, and one select node, and wherein the selected input is connected to the output in response to the index signal at the select node.

3. The analog-to-digital converter system of claim 1, wherein the mux controller includes a random sequence generator for generating the random sequence of index signals, a memory for storing the random sequence of index signals, and a controller.

4. The analog-to-digital converter system of claim 3, wherein the mux controller is run under an ADC conversion clock (ADC_CLK), and wherein each ADC clock cycle causes the counter to count one event and the controller to transmit one index signal from the memory to the select node of the multiplexer.

5. The analog-to-digital converter system of claim 4, wherein when the count of the counter reaches N, the controller causes the random sequence generator to generate a new random sequence of index signals and reseed the memory with the new random sequence.

6. The analog-to-digital converter system of claim 2, wherein the mux controller is a logic circuit that generates consecutive random sequences each of which include N randomized indices.

7. An analog-to-digital converter system, comprising:
   at least two sub-systems, each sub-system including:
      an analog-to-digital converter (ADC);
      a plurality of receivers each for capturing analog signals; and
      a multiplexer including a plurality of inputs each coupled to a respective one of the plurality of receivers and an output coupled to the ADC, the multiplexer establishing a signal path from a selected one of the plurality of inputs to the output in response to an index signal denoting the selected one of the plurality of inputs; and
   a mux controller to supply a random sequence of index signals to the multiplexer of each of the at least two sub-systems.

8. The analog-to-digital converter system of claim 7, wherein the multiplexer has N inputs, one output, and one select node, and wherein the selected input of each of the at least two sub-systems is connected to the output of the each of the at least two sub-systems in response to the index signal at the select node of the each of the at least two sub-systems.

9. The analog-to-digital converter system of claim 7, wherein the mux controller includes a random sequence generator for generating the random sequence of index signals, a memory for storing the random sequence of index signals, and a controller.

10. The analog-to-digital converter system of claim 9, wherein the mux controller is run under an ADC conversion clock (ADC_CLK), and wherein each ADC clock cycle causes the counter to count one event and the controller to transmit one index signal from the memory to the select node of the multiplexer in each of the at least two sub-systems.

11. The analog-to-digital converter system of claim 10, wherein when the count of the counter reaches N, the controller causes the random sequence generator to generate a new random sequence of index signals and reseed the memory with the new random sequence.

12. The analog-to-digital converter system of claim 8, wherein the mux controller is a logic circuit that generates consecutive random sequences each of which include N randomized indices.

13. An analog-to-digital converter system, comprising:
   at least two sub-systems, each sub-system cell including:
      an analog-to-digital converter (ADC);
      a plurality of receivers each for capturing analog signals;
      a multiplexer including a plurality of inputs each coupled to a respective one of the plurality of receivers and an output coupled to the ADC, the multiplexer establishing a signal path from a selected one of the plurality of inputs to the output in response to an index signal denoting the selected one of the plurality of inputs;
   a random sequence generator for generating a random sequence of index signals; and
   a memory for storing the random sequence of index signals, and a controller to supply the random sequence of index signals to the multiplexer.

14. The analog-to-digital converter system of claim 13, wherein the multiplexer has N inputs, one output, and one select node, and wherein the selected input is connected to the output in response to the index signal at the select node.

15. The analog-to-digital converter system of claim 13, further comprising:
a counter for counting a number of indices transmitted from the memory to the select node.

16. The analog-to-digital converter system of claim 15, wherein when the count of the counter reaches N, the controller causes the random sequence generator in each sub-system to generate a new randomized sequence of index signals and reseed the memory of the each sub-system with the new randomized sequence.

17. A method, comprising:
(aa) providing analog signals to a plurality of input nodes of a multiplexer;
(a) generating a random sequence of indices;
(b) transmitting an index from the random sequence of indices to a select node of the multiplexer;
(c) connecting a selected one of the plurality of input nodes of the multiplexer to an output node of the multiplexer, the selected one of the plurality of input nodes being selected based on the index; and
(ca) providing an analog signal through the signal path to an analog-to-digital converter.

18. The method of claim 17, further comprising:
(d) counting the connection in a counter;
(e) if a count in the counter is less than a number of the input nodes, repeat steps (b)-(d);
(f) if the count in the counter is equal to or more than the number of the input nodes, repeat steps (a)-(e);
wherein steps (b)-(d) are performed in one ADC clock cycle.

19. The method of claim 17, further comprising:
forming a signal path from the selected input node to the output node; and
converting the analog signal to a digital signal.

20. A signal processing chip, comprising:
a multiplexer for selectively connecting one of a plurality of input nodes of the multiplexer to a output node of the multiplexer, wherein an index signal at a select node of the multiplexer determines which one of the input node is connected to the output node; and
a controller to supply a sequence of randomized indices to the select node,
wherein the plurality of input nodes receives analog signals from a plurality of receivers, and the output node supplies an analog signal at the selected input node to an analog-to-digital converter.

21. The signal processing chip of claim 20, wherein the controller is run under an ADC conversion clock (ADC_CLK), and wherein each ADC clock cycle causes the controller to transmit one index signal from the memory to the select node of the multiplexer.

* * * * *